US012396148B2

(12) United States Patent
Suh et al.

(10) Patent No.: US 12,396,148 B2
(45) Date of Patent: Aug. 19, 2025

(54) METHOD OF MANUFACTURING INTEGRATED CIRCUIT DEVICE

(71) Applicant: SAMSUNG ELECTRONICS CO., LTD., Suwon-si (KR)

(72) Inventors: Minkyu Suh, Suwon-si (KR); Yangdoo Kim, Suwon-si (KR); Yonghwan Kim, Suwon-si (KR); Sangwuk Park, Suwon-si (KR); Geonyeop Lee, Suwon-si (KR); Dokeun Lee, Suwon-si (KR); Jungpyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 17/979,069

(22) Filed: Nov. 2, 2022

(65) Prior Publication Data

US 2023/0320061 A1 Oct. 5, 2023

(30) Foreign Application Priority Data

Mar. 31, 2022 (KR) .................. 10-2022-0040461

(51) Int. Cl.
*H10B 12/00* (2023.01)
(52) U.S. Cl.
CPC .................... *H10B 12/03* (2023.02)
(58) Field of Classification Search
CPC .............. H10B 12/03; H10B 12/033
See application file for complete search history.

(56) References Cited

U.S. PATENT DOCUMENTS

| 7,161,205 B2 | 1/2007 | Choi et al. |
| 9,236,292 B2 | 1/2016 | Romero et al. |
| 10,593,563 B2 | 3/2020 | Haba et al. |

(Continued)

FOREIGN PATENT DOCUMENTS

| CN | 114256267 A | 3/2022 |
| JP | 2010-199136 A | 9/2010 |

(Continued)

OTHER PUBLICATIONS

First Office Action issued Jul. 22, 2024 by the Taiwan Intellectual Property Office for the corresponding TW Patent Application No. 112111657.

*Primary Examiner* — Zandra V Smith
*Assistant Examiner* — Molly K Reida
(74) *Attorney, Agent, or Firm* — Muir Patent Law, PLLC

(57) ABSTRACT

A method of manufacturing an integrated circuit device includes forming a mold structure, which has a mold layer and a support layer sequentially stacked, on a substrate, forming a vertical hole through the mold structure in a vertical direction and a bowing space extending outward from the vertical hole in a horizontal direction in a first vertical level area, exposing the vertical hole and the bowing space to a preprocessing atmosphere to make the support layer have a first surface state and the mold layer have a second surface state different from the first surface state, forming a bowing complementary pattern filling the bowing space by a selective deposition process using the difference between the first surface state and the second surface state, and forming a lower electrode in the vertical hole and in contact with the mold layer, the support layer, and the bowing complementary pattern.

20 Claims, 20 Drawing Sheets

(56) References Cited

U.S. PATENT DOCUMENTS

| | | | |
|---|---|---|---|
| 2009/0212338 A1* | 8/2009 | Benson | H10B 12/033 |
| | | | 257/306 |
| 2018/0026040 A1 | 1/2018 | Hong et al. | |
| 2020/0144392 A1* | 5/2020 | Zhu | H10D 1/047 |
| 2022/0093629 A1 | 3/2022 | Kim et al. | |

FOREIGN PATENT DOCUMENTS

| | | |
|---|---|---|
| KR | 10-0555533 B1 | 3/2006 |
| KR | 10-0875658 B1 | 12/2008 |
| KR | 10-2009-0016813 A | 2/2009 |
| KR | 10-2009-0022678 A | 3/2009 |
| KR | 10-0919674 B1 | 10/2009 |
| KR | 10-2012-0004212 A | 1/2012 |
| KR | 10-2020-0128184 A | 11/2020 |
| TW | 201842643 A | 12/2018 |

\* cited by examiner

METHOD OF MANUFACTURING INTEGRATED CIRCUIT DEVICE

CROSS-REFERENCE TO RELATED APPLICATION

This application is based on and claims priority under 35 U.S.C. § 119 to Korean Patent Application No. 10-2022-0040461, filed on Mar. 31, 2022, in the Korean Intellectual Property Office, the disclosure of which is incorporated by reference herein in its entirety.

BACKGROUND

1. Field

Embodiments relate to a method of manufacturing an integrated circuit device, and more particularly, to a method of manufacturing an integrated circuit device including a capacitor.

2. Description of the Related Art

With the development in electronic technology, downscaling of semiconductor devices has rapidly progressed, and patterns forming electronic devices have been micronized accordingly. Thus, there is a need to develop integrated circuit devices having structures that maintain desired electrical characteristics by securing required capacitances despite the micronization of capacitors.

SUMMARY

According to an aspect of embodiments, there is provided a method of manufacturing an integrated circuit device, the method including forming a mold structure including a mold layer and a support layer that are sequentially stacked on a substrate. A vertical hole penetrating the mold structure in a vertical direction and a bowing space extending outwards from the vertical hole in a horizontal direction in a first vertical level area including a portion of the mold layer are formed by dry-etching the mold structure. A result, in which the vertical hole and the bowing space are formed, is exposed to a preprocessing atmosphere to make the support layer have a first surface state and the mold layer have a second surface state in the vertical hole, the second surface state being different from the first surface state. A bowing complementary pattern filling the bowing space is formed through a selective deposition process using a difference between the first surface state and the second surface state. A lower electrode is formed in a space limited by the mold layer, the support layer, and the bowing complementary pattern in the vertical hole.

According to another aspect of embodiments, there is provided a method of manufacturing an integrated circuit device, the method including forming a mold structure including a first mold layer, a first support layer, a second mold layer, and a second support layer that are sequentially stacked on a substrate. A plurality of vertical holes penetrating the mold structure in a vertical direction and a plurality of bowing spaces extending outwards from the plurality of vertical holes in a horizontal direction in a first vertical level area including a portion of the second mold layer are formed by dry-etching the mold structure. A result, in which the plurality of vertical holes and the plurality of bowing spaces are formed, is exposed to a preprocessing atmosphere to make the first and second support layers have a first surface state and the first and second mold layers have a second surface state, the second surface state being different from the first surface state. A bowing complementary layer selectively covering only a surface of each of the first and second mold layers from among the first mold layer, the first support layer, the second mold layer, and the second support layer and filling the bowing space in each of the plurality of vertical holes are formed by performing a selective deposition process using a difference between the first surface state and the second surface state. A bowing complementary pattern is formed by removing a portion of the bowing complementary layer in each of the plurality of vertical holes. A lower electrode is formed in a space limited by the first mold layer, the first support layer, the second mold layer, the second support layer, and the bowing complementary pattern in each of the plurality of vertical holes.

According to another aspect of embodiments, there is provided a method of manufacturing an integrated circuit device, the method including forming a mold structure including a first oxide layer, a first support layer, a second oxide layer, and a second support layer that are sequentially stacked on a substrate. A plurality of vertical holes penetrating the mold structure in a vertical direction and a plurality of bowing spaces extending outwards from the plurality of vertical holes in a horizontal direction in a first vertical level area including a portion of the second oxide layer are formed by dry-etching the mold structure. A result, in which the plurality of vertical holes and the plurality of bowing spaces are formed, is exposed to a preprocessing atmosphere to make the first and second support layers have a first surface state and the first and second oxide layers have a second surface state, the second surface state being different from the first surface state. A bowing complementary pattern filling the bowing space is formed by performing a selective deposition process using a difference between the first surface state and the second surface state. A lower electrode is formed in a space limited by the first oxide layer, the first support layer, the second oxide layer, the second support layer, and the bowing complementary pattern in each of the plurality of vertical holes.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
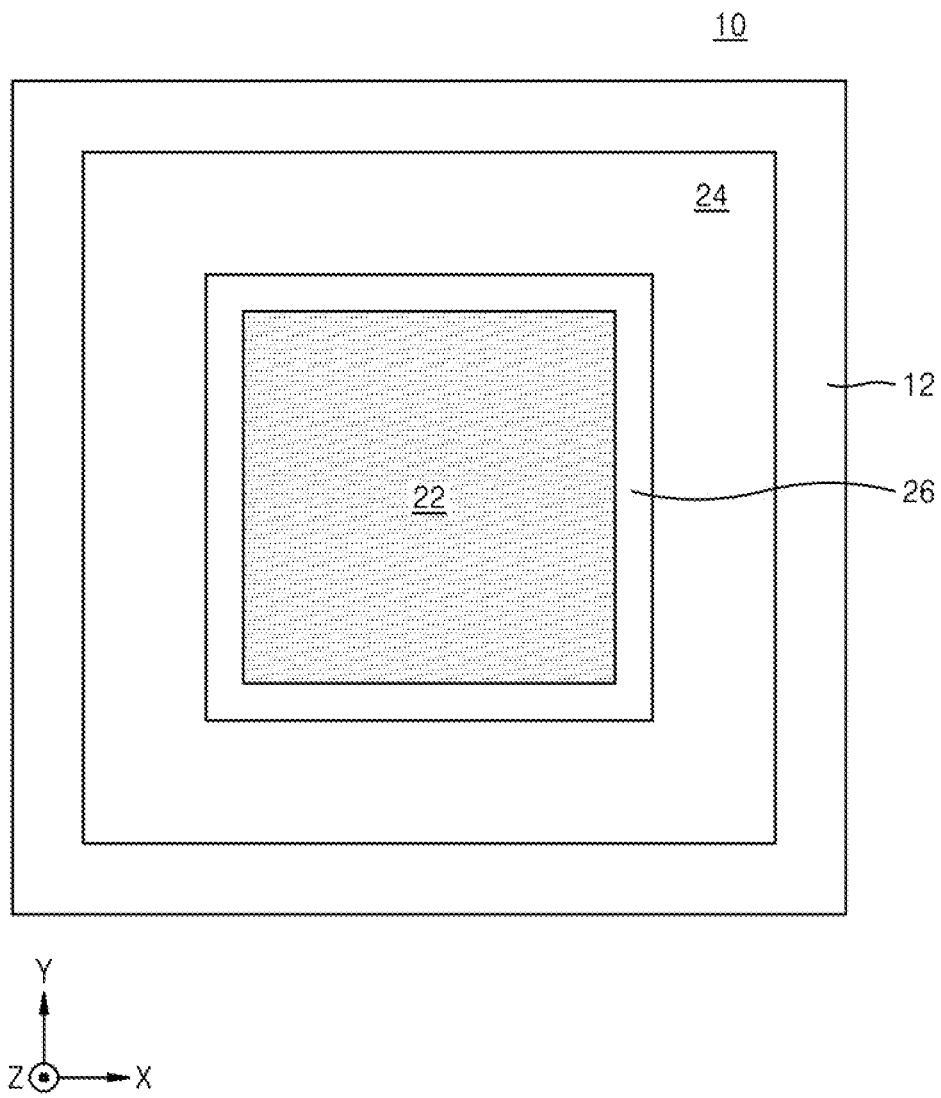
FIG. 1 is a plan view of a schematic structure of an integrated circuit device, according to embodiments.

FIG. 1 is a plan view of a schematic structure of an integrated circuit device 10 according to embodiments.

Referring to FIG. 1, the integrated circuit device 10 may include a substrate 12 having a memory cell area 22, a peripheral circuit area 24 surrounding, e.g., an entire perimeter of, the memory cell area 22, and an interface area 26 between the memory cell area 22 and the peripheral circuit area 24.

The substrate 12 may include a semiconductor element, e.g., silicon (Si) or germanium (Ge), or at least one compound semiconductor, e.g., at least one of silicon-germanium (SiGe), silicon carbide (SiC), gallium arsenide (GaAs), indium arsenide (InAs), and indium phosphide (InP). The substrate 12 may include a conductive area, e.g., a well doped with impurities or a structure doped with impurities.

In embodiments, the memory cell area 22 may include a memory cell area of Dynamic Random Access Memory (DRAM). The memory cell area 22 may include a plurality of unit memory cells including transistors and capacitors. The peripheral circuit area 24 may be an area where peripheral circuits required to drive the memory cells in the memory cell area 22 are arranged. In the interface area 26, conductive lines for an electrical connection between the memory cell area 22 and the peripheral circuit area 24 and insulation structures for insulating the memory cell area 22 from the peripheral circuit area 24 may be arranged.

Figure 2:
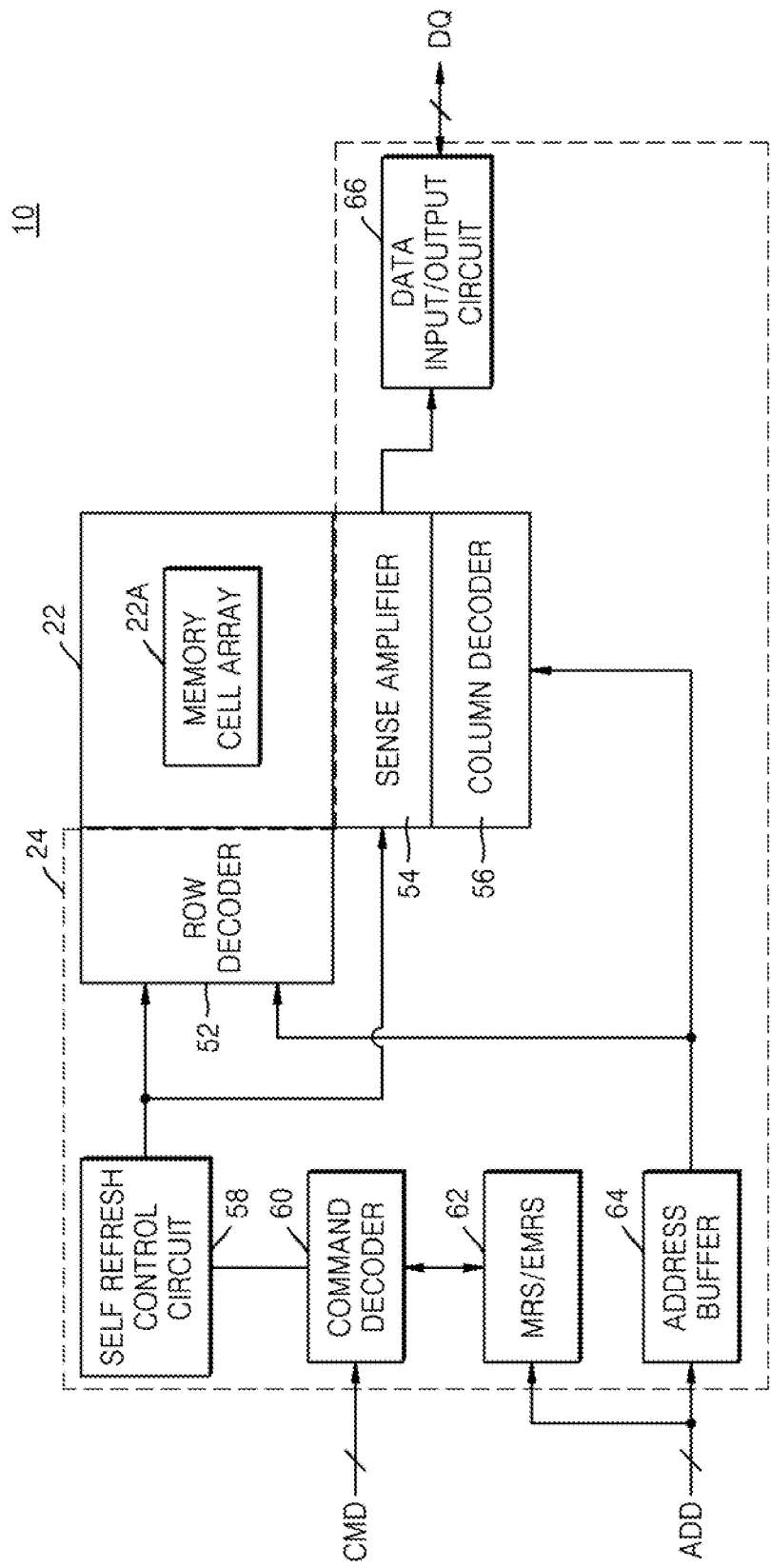
FIG. 2 is a block diagram of an example structure of an integrated circuit device including a Dynamic Random Access Memory (DRAM) device.

FIG. 2 is a block diagram of an example structure of the integrated circuit device 10 including a DRAM device.

Referring to FIG. 2, the memory cell area 22 may include a memory cell array 22A. In the memory cell array 22A, a plurality of memory cells for storing data may be arranged in a row direction and a column direction. The memory cells may each include a cell capacitor and an access transistor. A gate of the access transistor may be connected to its corresponding word line of word lines arranged in a row direction, one of a source and a drain of the access transistor may be connected to a bit line or a complementary bit line arranged in a column direction, and the other of the source and the drain of the access transistor may be connected to the cell capacitor.

The peripheral circuit area 24 may include a row decoder 52, a sense amplifier 54, a column decoder 56, a self-refresh control circuit 58, a command decoder 60, a Mode Register Set/Extended Mode Register Set (MRS/EMRS) circuit 62, an address buffer 64, and a data input/output circuit 66.

The sense amplifier 54 may detect and amplify data in a memory cell and store the data in the memory cell. The sense amplifier 54 may be or include a cross-coupled amplifier connected to a bit line and a complementary bit line included in the memory cell array 22A.

Data DQ that is input through the data input/output circuit 66 may be written in the memory cell array 22A in response to an address signal ADD, and data DQ that is read from the memory cell array 22A in response to the address signal ADD may be externally output through the data input/output circuit 66. To designate a memory cell to/from which the data is to be written/read, the address signal ADD may be input to the address buffer 64. The address buffer 64 may temporarily store the address signal ADD that is externally input.

The row decoder 52 may decode a row address from among the address signals ADD output from the address buffer 64 to designate a word line connected to a memory cell to/from which the data is input/output. That is, the row decoder 52 may decode a row address output from the address buffer 64 and thus enable a word line corresponding to the row address, in a data write or read mode. Also, the row decoder 52 may decode a row address generated from an address counter and thus enable a word line corresponding to the row address, in a self-refresh mode.

The column decoder 56 may decode a column address from among the address signals ADD from the address buffer 64 to designate a bit line connected to a memory cell to or from which the data is input or output. The memory cell array 22A may output the data from a memory cell designated by the row and column addresses or may write the data on the memory cell.

The command decoder 60 may receive command signals CMD from the outside and decode the command signals CMD, thus internally generating the decoded command signals CMD, e.g., a self-refresh entry command or a self-refresh exit command.

The MRS/EMRS circuit 62 may configure an internal mode register in response to an MRS/EMRS command and an address signal ADD for designating an operation mode of the integrated circuit device 10.

The integrated circuit device 10 may further include, e.g., a clock circuit configured to generate clock signals, a power circuit configured to generate or assign an internal voltage by receiving an external power voltage, and the like.

The self-refresh control circuit 58 may control a self-refresh operation of the integrated circuit device 10 in response to a command output from the command decoder 60. The command decoder 60 may include, e.g., an address counter, a timer, and a core voltage generator. The address counter may generate a row address for designating a row address, which is subject to the self-refreshing, in response to the self-refresh entry command from the command decoder 60 and may apply the generated row address to the row decoder 52. The address counter may stop a counting operation in response to the self-refresh exit command output from the command decoder 60.

Figure 3:
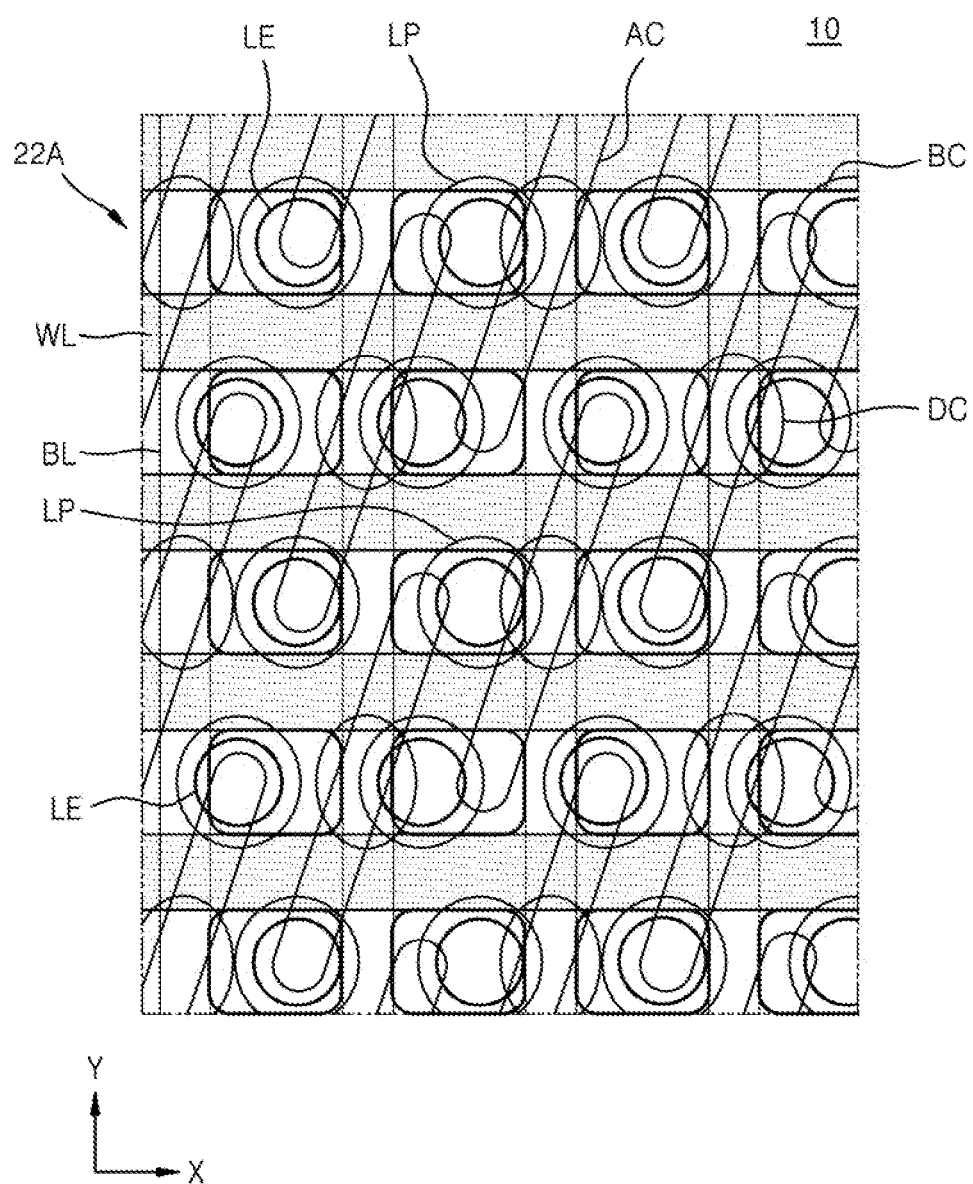
FIG. 3 is a schematic planar layout of some components of a memory cell array of FIG. 2.

FIG. 3 is a schematic planar layout of some components of the memory cell array 22A of FIG. 2.

Referring to FIG. 3, the integrated circuit device 10 may include a plurality of active areas AC arranged to horizontally extend in a direction diagonal to a first horizontal direction (an X direction) and a second horizontal direction (a Y direction) that are orthogonal to each other on a plane. Word lines WL may cross the active areas AC and extend in parallel to each other in the first horizontal direction (the X direction). On the word lines WL, bit lines BL may extend in parallel to each other in the second horizontal direction (the Y direction). The bit lines BL may be connected to the active areas AC through direct contacts DC, respectively.

A plurality of buried contacts BC may be formed between two adjacent bit lines BL from among the bit lines BL. On the buried contacts BC, a plurality of lower electrode landing pads LP may be formed. The lower electrode landing pads LP may be arranged to at least partially overlap the buried contacts BC, respectively. On the lower electrode landing pads LP, lower electrodes LE may be formed apart from each other. The lower electrodes LE may be respectively connected to the active areas AC through the buried contacts BC and the lower electrode landing pads LP.

FIGS. 4A to 4K are cross-sectional views of stages in a method of manufacturing an integrated circuit device, according to embodiments. A method of manufacturing an integrated circuit device 100 (see FIG. 4K) including the memory cell array 22A of FIG. 3 is described with reference to FIGS. 4A to 4K as an example.

Figure 4A:
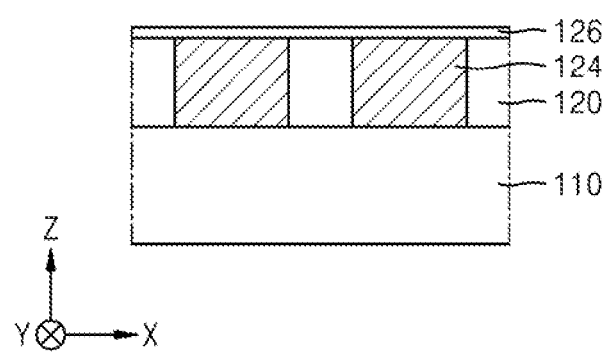
FIGS. 4A to 4K are cross-sectional views of stages in a manufacturing method of an integrated circuit device, according to embodiments.

Referring to FIG. 4A, a substrate 110 including the active areas AC of FIG. 3 may be prepared. A lower structure 120 and conductive areas 124 connected to the active areas AC (see FIG. 3) through the lower structure 120 may be formed on the substrate 110. Then, an insulating layer 126 may be formed on the lower structure 120 and the conductive areas 124 to cover the lower structure 120 and the conductive areas 124.

The substrate 110 may be part of the substrate 12 of FIG. 1. The conductive areas 124 may be respectively connected to the active areas AC included in the substrate 110 through the lower structure 120.

The substrate 110 may include a semiconductor element, e.g., Si or Ge, or a compound semiconductor, e.g., SiC, GaAs, InAs, or InP. The substrate 110 may include a semiconductor substrate, at least one insulating layer formed on the semiconductor substrate, or structures including at least one conductive area. The conductive area may include, e.g., a well doped with impurities or a structure doped with impurities. On the substrate 110, a device isolation area defining the active areas AC may be formed. The device isolation area may include, e.g., an oxide layer, a nitride layer, or a combination thereof.

In embodiments, the lower structure 120 may include an insulating layer including, e.g., a silicon oxide layer, a silicon nitride layer, or a combination thereof. In some embodiments, the lower structure 120 may include various conductive areas, e.g., a wire layer, a contact plug, and a transistor, and an insulating layer that insulates the above conductive areas from each other. The conductive areas 124 may include, e.g., polysilicon, metal, conductive metal nitride, metal silicide, or a combination thereof. The lower structure 120 may include the bit lines BL described with reference to FIG. 3. The conductive areas 124 may each include the buried contact BC and the lower electrode landing lad LP described with reference to FIG. 3.

The insulating layer 126 may include an insulating material having an etching selectivity with respect to the lower structure 120. In embodiments, the insulating layer 126 may include, e.g., a silicon boron nitride (SiBN) layer, a silicon carbonitride (SiCN) layer, a silicon nitride (SiN) layer, or a combination thereof. The terms "SiBN," "SiCN," and "SiN" used in the present specification denote materials containing elements included in the above terms, but they are not chemical formulas indicating a stoichiometric relation. The insulating layer 126 may be used as an etch stop layer in a subsequent process.

Figure 4B:
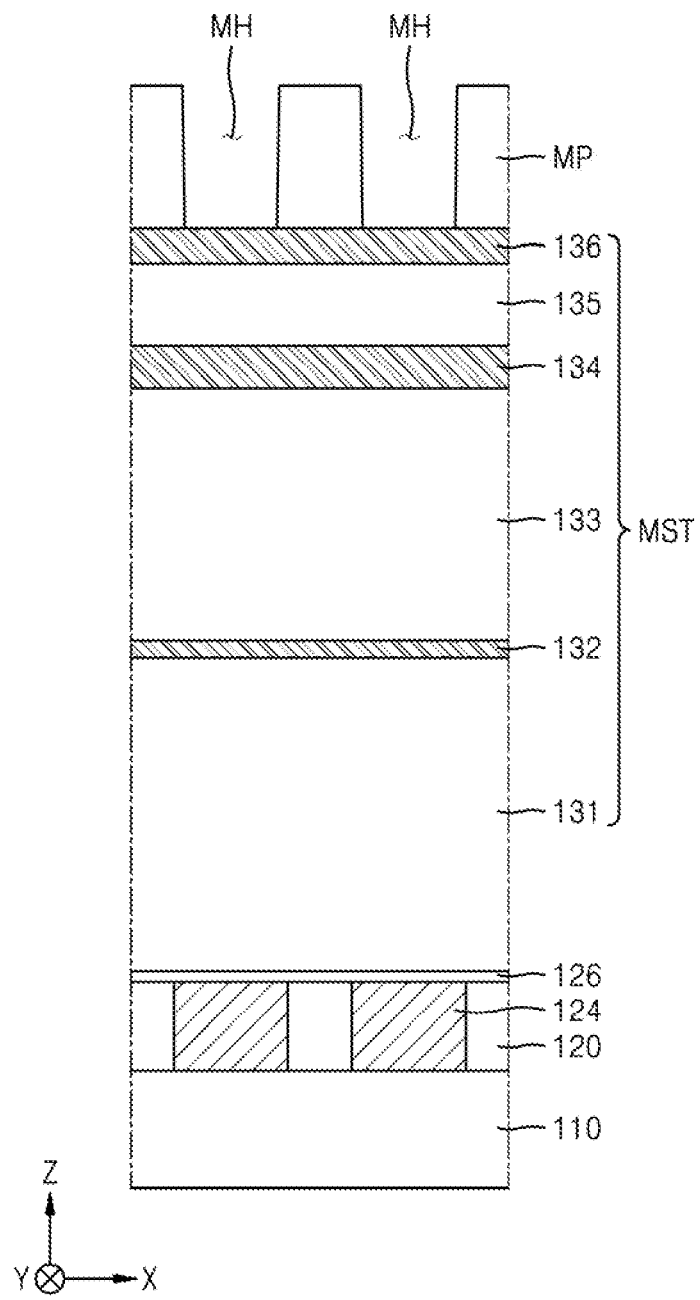

Referring to FIG. 4B, a mold structure MST may be formed on the insulating layer 126, and a mask pattern MP may be formed on the mold structure MST.

The mold structure MST may include a plurality of mold layers and a plurality of support layers, e.g., a plurality of alternating mold layers and support layers. For example, the mold structure MST may include a first mold layer 131, a first support layer 132, a second mold layer 133, a second support layer 134, a third mold layer 135, and a third support layer 136 that are sequentially stacked on the insulating layer 126.

In embodiments, the first mold layer 131, the second mold layer 133, and the third mold layer 135 may each include, e.g., a silicon oxide layer, a silicon nitride layer, or a combination thereof. For example, the first mold layer 131 and the second mold layer 133 may each include a silicon oxide layer, e.g., so the first and second mold layers 131 and 133 may each include oxygen atoms but no nitrogen atoms, and the third mold layer 135 may include a silicon nitride layer, e.g., so the third mold layer 135 may include nitrogen atoms.

For example, the first support layer 132, the second support layer 134, and the third support layer 136 may each include a SiN layer, a SiCN layer, a SiBN layer, or a combination thereof, e.g., so each of the first support layer 132, the second support layer 134, and the third support layer 136 may include nitrogen atoms. For example, the first support layer 132, the second support layer 134, and the third support layer 136 may each include a SiCN layer.

The mask pattern MP may include, e.g., a nitride layer, an oxide layer, a polysilicon layer, a photoresist layer, or a combination thereof. A plurality of holes MH may be formed in the mask pattern MP.

Figure 4C:
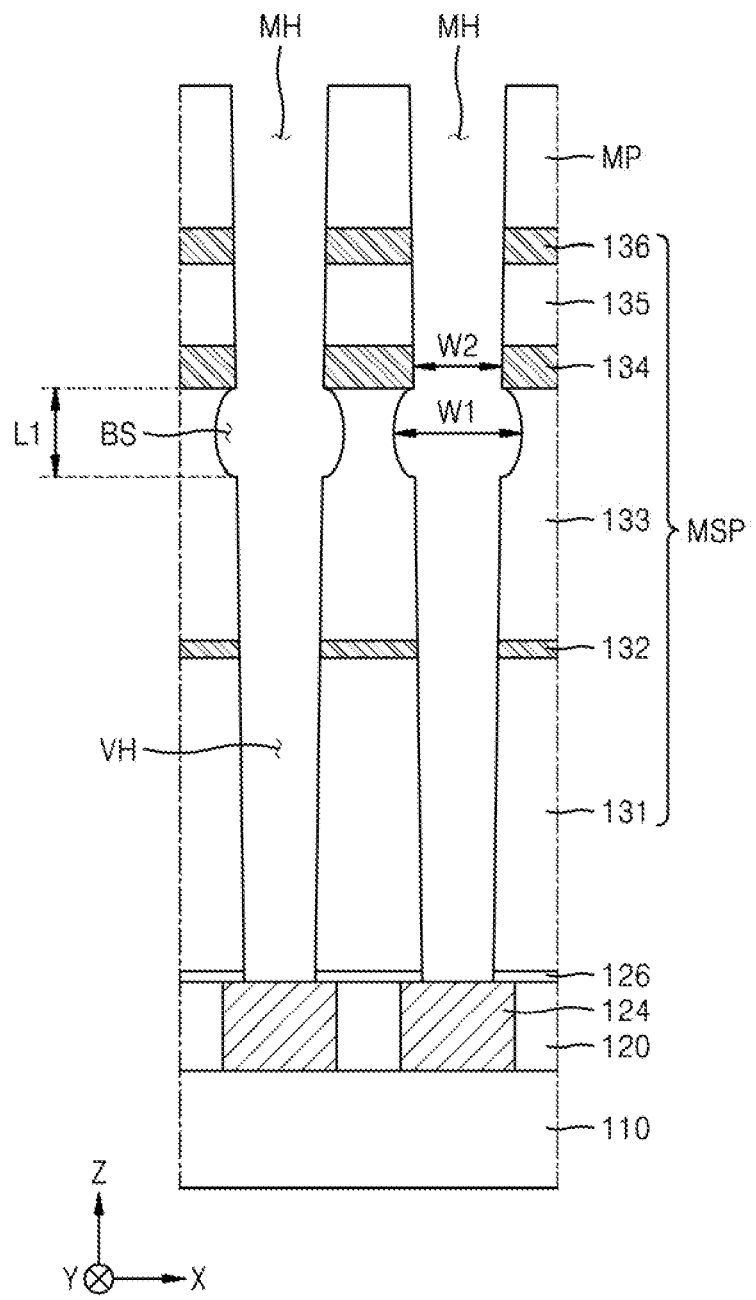

Referring to FIG. 4C, the mold structure MST and the insulating layer 126 may be anisotropically dry-etched by using the mask pattern MP as an etch mask and the insulating layer 126 as an etch stop layer in the structure of FIG. 4B, so that a mold structure pattern MSP defining a plurality of vertical holes VH may be formed. After the vertical holes VH are formed, a conductive area 124 may be exposed at the bottom of each vertical hole VH.

Because of ion scattering caused while the mold structure MST is anisotropically dry-etched to form the vertical holes VH, lateral etching may occur in a first vertical level area L1 including the second mold layer 133 in each vertical hole VH. For example, as illustrated in FIG. 4C, portions of the second mold layer 133 may be laterally overetched, thereby causing a bowing phenomenon. As a result, unlike other vertical level areas (e.g., which may maintain substantially parallel and linear sidewalls), a bowing space BS extending outwardly, e.g., away, from the vertical hole VH in a horizontal direction may be formed in the first vertical level area L1. For example, as illustrated in FIG. 4C, the bowing space BS may be a curved space extending laterally, e.g., in the X-direction, into the second mold layer 133 beyond the level, e.g., flat, sidewalls of the vertical hole VH.

A first maximum lateral width W1 (e.g., in the X-direction) in the first vertical level area L1, i.e., a widest distance along the X-direction between directly facing curved surfaces of adjacent bowing spaces BS, may be greater than a second maximum lateral width W2 (e.g., in the X-direction) in a vertical level area defined by the second support layer 134, e.g., a distance between directly facing sidewalls (e.g., that are parallel to each other) of the second support layer 134. The first maximum lateral width W1 and the second maximum lateral width W2 may be measured along a same direction (e.g., in the X-direction) in vertically adjacent layers.

In the present example, a case where the bowing space BS is formed in the second mold layer 133 is described, but one or more embodiments are not limited thereto. For example, while an anisotropic dry-etching process of forming the vertical holes VH is performed, a bowing space may be formed in at least one of the first mold layer 131, the second mold layer 133, and the third mold layer 135 in each vertical hole VH, and depending on a location of the bowing space, processes described below may be appropriately changed or modified within embodiments to obtain identical or similar results to the processes below.

Figure 4D:
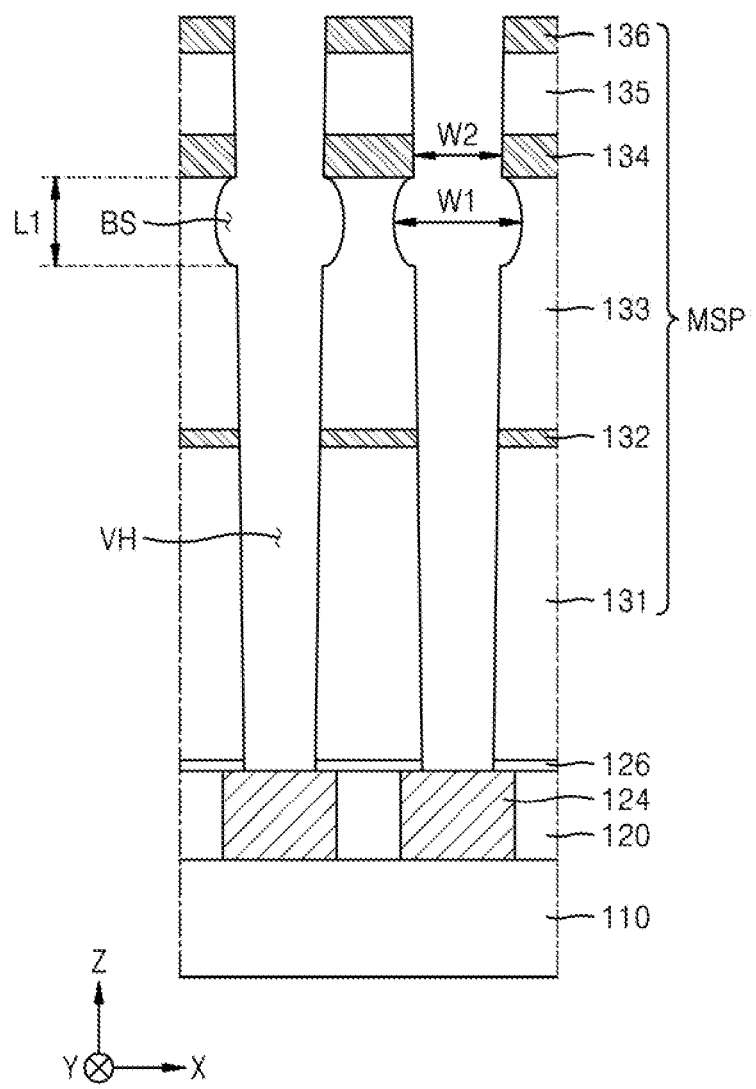

Referring to FIG. 4D, the mask pattern MP may be removed from the resultant structure of FIG. 4C, and the upper surface of the third support layer 136 may be exposed. In embodiments, an etch-back process may be performed to remove the mask pattern MP.

In the resultant structure of FIG. 4D, the first mold layer 131 and the second mold layer 133 (which include oxygen atoms but do not include nitrogen atoms), and the first support layer 132, the second support layer 134, the third mold layer 135, and the third support layer 136 (which include nitrogen atoms) may be exposed in each vertical hole VH. The third support layer 136 including nitrogen atoms may be exposed to the outside near the entrance of each vertical hole VH, e.g., the third support layer 136 may have sidewalls exposed to the vertical hole VH and an upper surface exposed to the outside of the resultant structure.

Figure 4E:
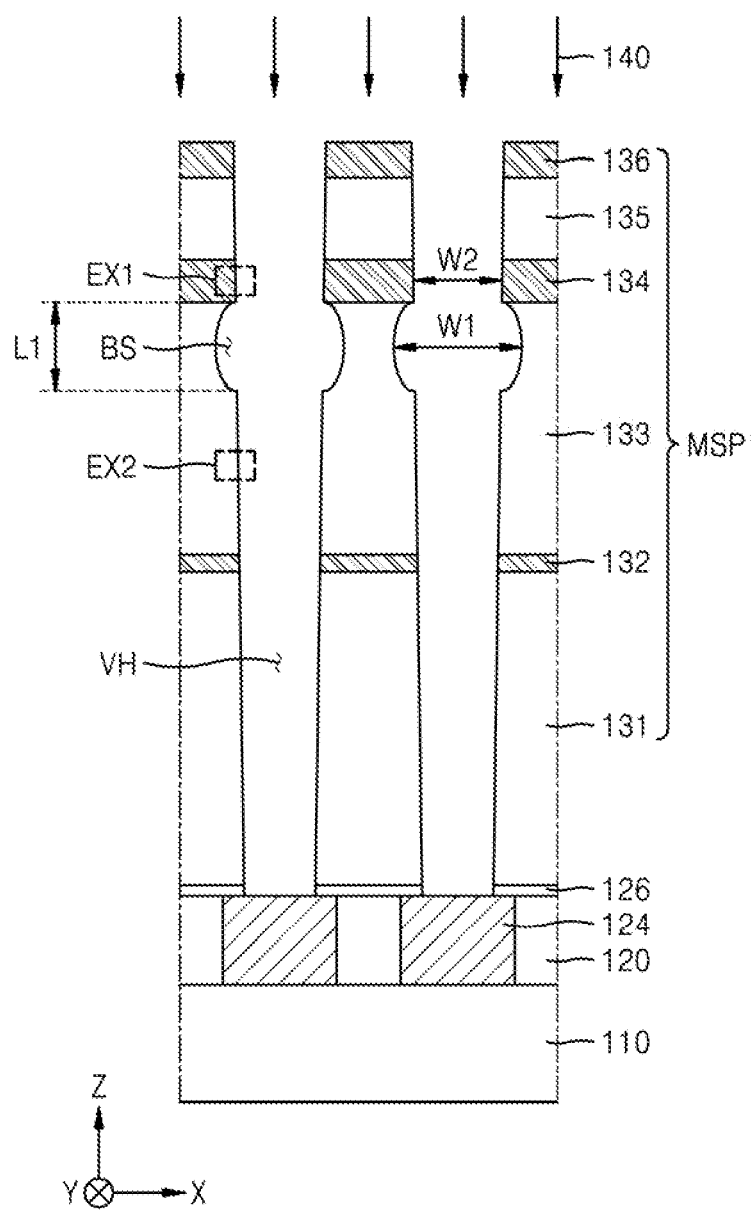

Referring to FIG. 4E, the resultant structure of FIG. 4D may be exposed to a preprocessing atmosphere 140 to enable a surface of each of the first support layer 132, the second support layer 134, the third mold layer 135, and the third support layer 136 (all of which include nitrogen atoms) to have a different surface state from a surface of each of the first mold layer 131 and the second mold layer 133 (both of which include oxygen atoms but do not include nitrogen atoms). For example, a surface of each of the layers exposed in the vertical hole VH may interact with the preprocessing atmosphere 140 to have a different terminal group, in accordance with components on its surface prior to preprocessing, e.g., oxygen or nitrogen atoms.

In embodiments, the preprocessing atmosphere 140 may include an HF solution. After the resultant structure of FIG. 4D is exposed to the preprocessing atmosphere 140 including the HF solution, an exposed surface of each of the first support layer 132, the second support layer 134, the third mold layer 135, and the third support layer 136 (which include nitrogen atoms) may have a first surface state (i.e., region EX1) of an NHx terminal, e.g., a —NH terminal or a —NH$_2$ terminal. After the resultant structure of FIG. 4D is exposed to the preprocessing atmosphere 140 including the HF solution, an exposed surface of each of the first mold layer 131 and the second mold layer 133 (which include oxygen atoms but do not include nitrogen atoms) may have a second surface state (i.e., region EX2) of a hydroxy group (—OH) terminal.

Figure 5A:
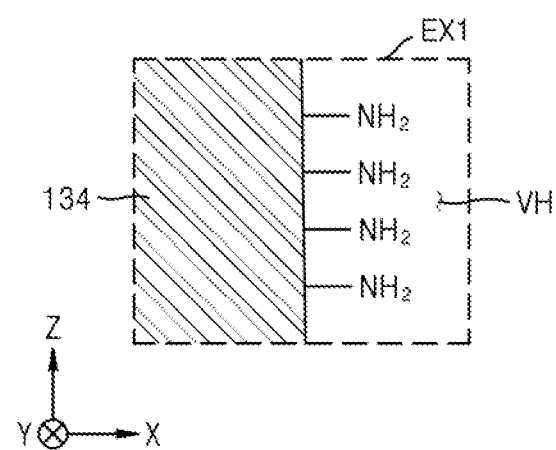
FIG. 5A illustrates a surface state of region "EX1" of FIG. 4E as an example.
Figure 5B:
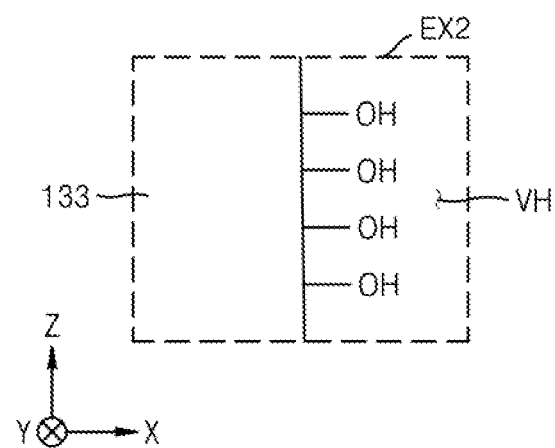
FIG. 5B illustrates a surface state of region "EX2" of FIG. 4E as an example.

FIG. 5A illustrates the first surface state of region "EX1" of FIG. 4E as an example, and FIG. 5B illustrates the second surface state of region "EX2" of FIG. 4E as an example.

Referring to FIGS. 4E, 5A, and 5B, the exposed surface of each of the first support layer 132, the second support layer 134, the third mold layer 135, and the third support layer 136, which include nitrogen atoms, may have a first surface of the —NH$_2$ terminal group after being exposed to the preprocessing atmosphere 140, similar to the illustration of FIG. 5A. In addition, the exposed surface of each of the first mold layer 131 and the second mold layer 133, which include oxygen atoms but do not include nitrogen atoms, may have a second surface of the —OH terminal group after being exposed to the preprocessing atmosphere 140, similar to the illustration of FIG. 5B.

Figure 4F:
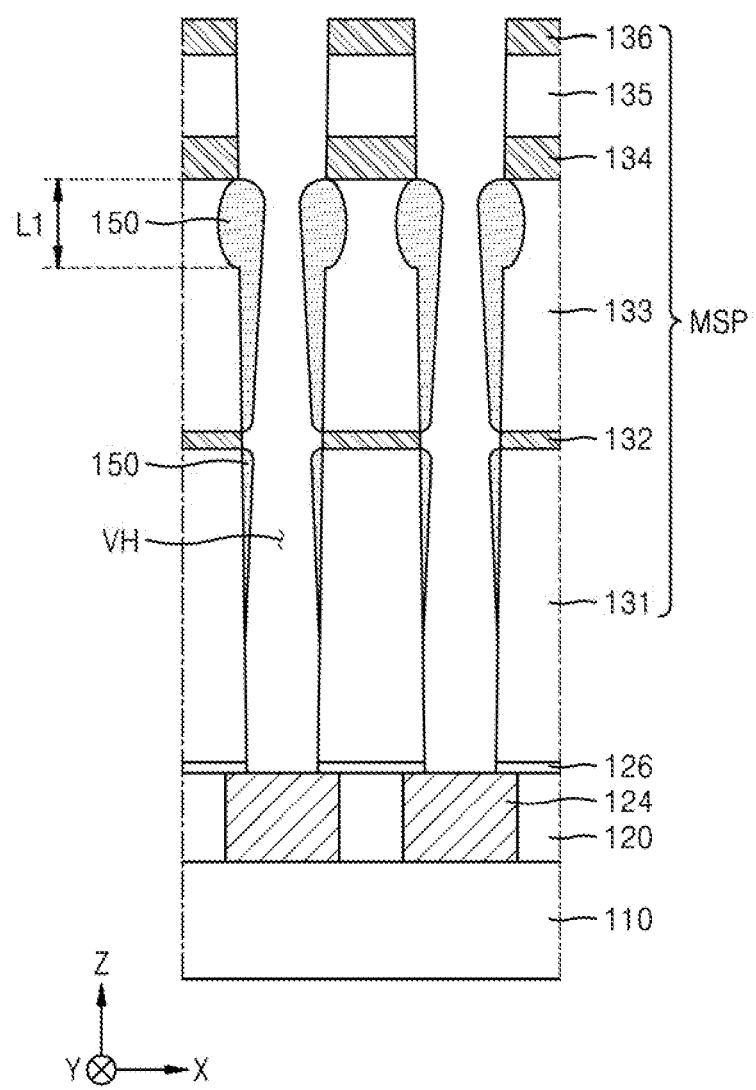

Referring to FIG. 4F, a bowing complementary layer 150 may be selectively formed in the vertical hole VH, in accordance with the terminal groups on sidewalls of the vertical hole VH. For example, the bowing complementary layer 150 may be selectively formed only on the exposed surface of each of the first mold layer 131 and the second mold layer 133 having the second surface of the —OH terminal from among the exposed surfaces in the result of FIG. 4E. For example, the bowing complementary layer 150 may include a silicon oxide layer.

A selective deposition process by Area Selective Deposition (ASD) may be performed to form the bowing complementary layer 150. As used herein, the term "selective deposition process" indicates a process whereby deposition is actually performed on one surface selected from the first surface and the second surface, which have different surface characteristics, and deposition is not performed on the other surface that is not selected.

In embodiments, the bowing complementary layer 150 may be formed as follows. A first process may include selectively forming a chemisorption layer, i.e., a chemical adsorption layer, of a silicon precursor only on the exposed surface of each of the first mold layer 131 and the second mold layer 133 that have the second surface of the —OH terminal by providing the silicon precursor. Then, a second process may be performed and may include removing unnecessary by-products by providing a purge gas to a result on which the chemisorption layer of the silicon precursor is formed. Then, a third process may be performed and may include forming a silicon oxide layer in an atomic layer unit from the chemisorption layer of the silicon precursor by providing an oxidizing gas to the chemisorption layer of the silicon precursor. Then, a fourth process may be performed and may include removing unnecessary by-products by providing the purge gas to a result on which the silicon oxide layer is formed. The first to fourth processes may be performed multiple times when the bowing space BS horizontally extending in each vertical hole VH is filled with the bowing complementary layer 150 including the silicon oxide layer.

The surface of each of the first support layer 132, the second support layer 134, the third mold layer 135, and the third support layer 136 may have no chemical affinity with the silicon precursor or may be in a low stabilization state because of the —NH$_2$ terminal exposed. Therefore, when the silicon precursor is provided to the resultant structure of FIG. 4E during the first process, the chemisorption layer of the silicon precursor may not be formed on the surface of each of the first support layer 132, the second support layer 134, the third mold layer 135, and the third support layer 136, and may be selectively formed only on the exposed surface of each of the first mold layer 131 and the second mold layer 133 that have the surface state of the —OH terminal. Accordingly, in each vertical hole VH, the bowing complementary layer 150 may be selectively formed only on the exposed surface of each of the first mold layer 131 and the second mold layer 133.

Also, in performing selective deposition including the first to fourth processes, as an aspect ratio of each vertical hole VH increases, the flux amount of a chemical substance reaching a target location may decrease from the entrance of each vertical hole VH to the bottom surface thereof. As a result, the bowing complementary layer 150 may have a relatively great thickness in the first vertical level area L1 relatively close to the entrance of each vertical hole VH, and the thickness of the bowing complementary layer 150 may decrease towards the bottom surface of each vertical hole VH. As a step coverage of the bowing complementary layer 150 is controlled by appropriately adjusting deposition conditions during the deposition process of forming the bowing complementary layer 150, the bowing complementary layer 150 having a desired thickness depending on locations thereof in each vertical hole VH may be obtained.

In embodiments, the bowing complementary layer 150 may be formed to have a relatively great thickness in the first vertical level area L1 including the bowing space BS in each vertical hole VH and have a thickness decreasing from the first vertical level area L1 toward the bottom surface of each vertical hole VH. Accordingly, a first thickness of a first portion of the bowing complementary layer 150, which covers the surface of the first mold layer 131, may be greater than a second thickness of a second portion of the bowing complementary layer 150, which covers the surface of the second mold layer 133, in each of the vertical holes VH.

In embodiments, in performing the selective deposition process of forming the bowing complementary layer 150, the silicon precursor used in the first process may include amino silane. For example, the silicon precursor may include N-(diethylaminosilyl)-N-ethylethaneamine, bis(diethylamino)silane, diisopropylaminosilane, diisobutylaminosilane, bis(tert-butylamino)silane, tris(dimethylamino)silane, or a combination thereof. A purge gas used in the second process and the fourth process may include an inert gas, e.g., argon (Ar), helium (He), or neon (Ne), or nitrogen ($N_2$) gas. An oxidizing gas used in the third process may include, e.g., oxygen ($O_2$), ozone ($O_3$), water ($H_2O$), nitrogen dioxide ($NO_2$), nitrogen monoxide (NO), nitrous oxide ($N_2O$), carbon monoxide (CO), carbon dioxide ($CO_2$), hydrogen peroxide ($H_2O_2$), formic acid (HCOOH), acetic acid ($CH_3COOH$), acetic anhydride (($CH_3CO)_2O$), an alcohol, a peroxide, sulfur oxide, plasma $O_2$, remote plasma $O_2$, plasma $N_2O$, plasma $H_2O$, or a combination thereof.

Figure 4G:
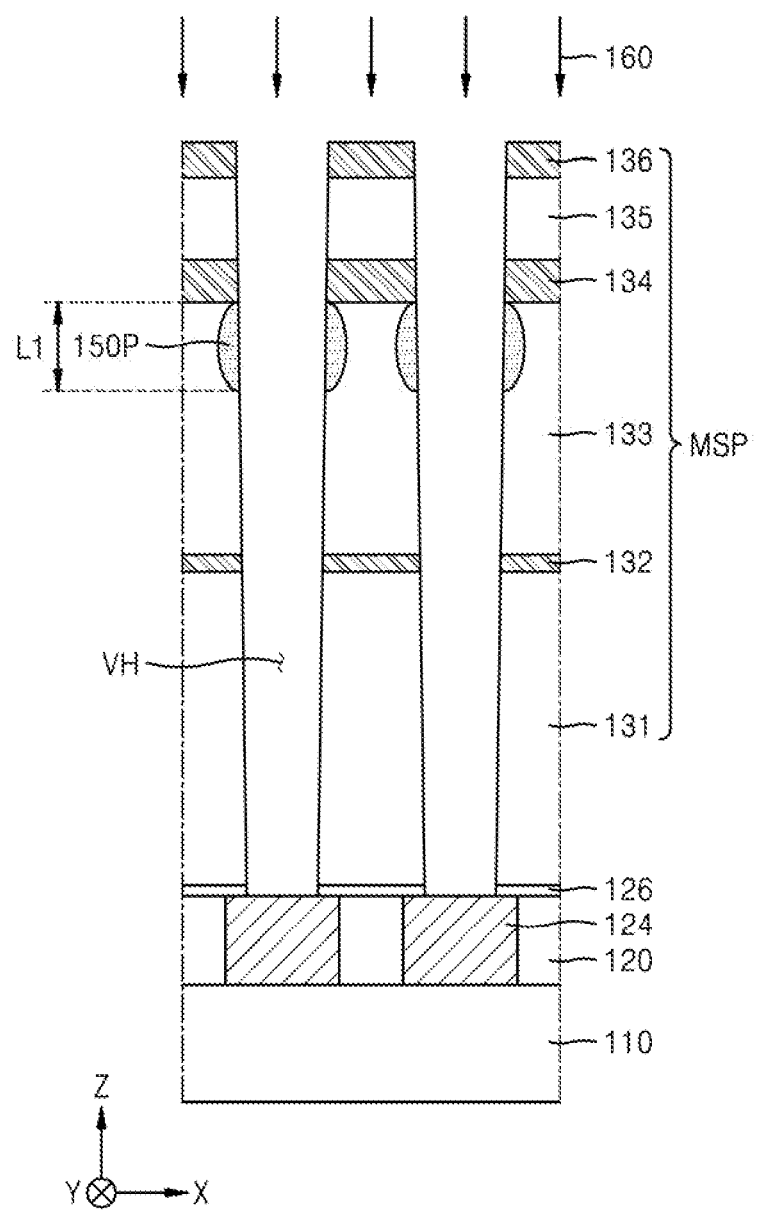

Referring to FIG. 4G, a bowing complementary pattern 150P filling the bowing space BS in the first vertical level area L1 in each vertical hole VH may be formed by removing a portion of the bowing complementary layer 150 from the resultant structure of FIG. 4F by using an etch atmosphere 160. That is, as illustrated in FIG. 4G, a sidewall of the bowing complementary pattern 150P facing the vertical hole VH may be coplanar, e.g., level, with a sidewall of the second mold layer 133 facing the vertical hole VH. After the bowing complementary pattern 150P is formed, the surface of each of the first mold layer 131 and the second mold layer 133 may be exposed again in each vertical hole VH at other vertical levels except the first vertical level area L1 including the bowing space BS.

In embodiments, the etch atmosphere 160 may include a combination of a first etchant and a second etchant, where the first etchant contains sulfuric acid ($H_2SO_4$), hydrogen peroxide (14202), and pure water, and the second etchant contains a hydrofluoric acid (HF) solution. Using the etch atmosphere 160 refers to applying the first and second etchants to the vertical hole VH, e.g., to the bowing complementary layer 150.

After the bowing complementary pattern 150P is formed using the etch atmosphere 160, the bowing complementary pattern 150P may not include a portion projecting towards the inside of the vertical hole VH and remain only in the bowing space BS. After the bowing complementary pattern 150P is formed, the vertical hole VH may have smooth internal sidewalls without unevenness.

Figure 4H:
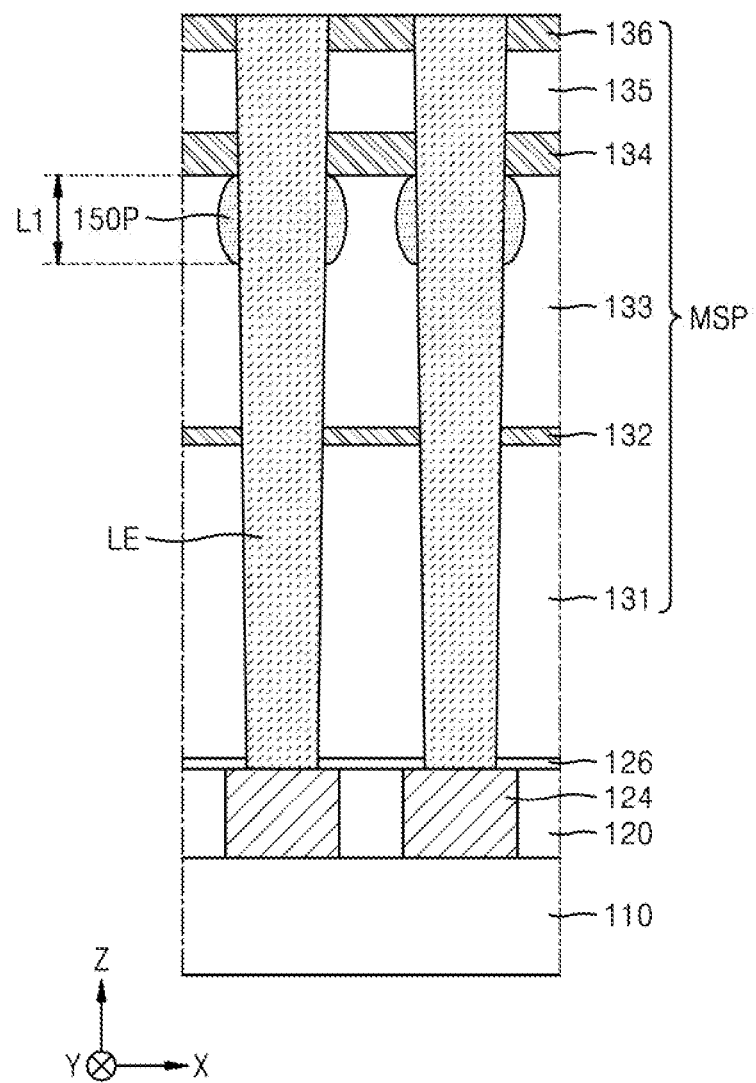

Referring to FIG. 4H, the lower electrodes LE may be formed in the vertical holes VH. The lower electrodes LE may, e.g., completely, fill the vertical holes VH, including portions contacting, e.g., laterally overlapping, the bowing complementary patterns 150P.

For example, a conductive layer may be formed to fill the vertical holes VH and cover the upper surface of the third support layer 136 of the resultant structure of FIG. 4G to form the lower electrodes LE. The conductive layer may be formed by, e.g., a chemical vapor deposition (CVD) process, a plasma enhanced CVD (PECVD) process, a metal organic CVD (MOCVD) process, or an atomic layer deposition (ALD) process. Then, the upper surface of the third support layer 136 may be exposed by removing a part of the conductive layer by, e.g., an etch-back process or a chemical mechanical polishing (CMP) process.

For example, the lower electrodes LE may each include a metal layer, a conductive metal oxide layer, a conductive metal nitride layer, a conductive metal oxynitride layer, or a combination thereof. For example, the lower electrodes LE may each include niobium (Nb), niobium oxide (NbO), niobium nitride (NbN), niobium oxynitride (NbON), titanium (Ti), titanium oxide (TiO), titanium nitride (TiN), titanium oxynitride (TiON), cobalt (Co), cobalt oxide (CoO), cobalt nitride (CoN), cobalt oxynitride (CoON), tin (Sn), tin oxide ($SnO_2$), tin nitride, tin oxynitride, or a combination thereof. For example, each lower electrode LE may include NbN, TiN, CoN, $SnO_2$, or a combination thereof. In another example, each lower electrode LE may include tantalum nitride (TaN), titanium aluminum nitride (TiAlN), tantalum aluminum nitride (TaAlN), vanadium (V), vanadium nitride (VN), molybdenum (Mo), molybdenum nitride (MoN), tungsten (W), tungsten nitride (WN), ruthenium (Ru), ruthenium oxide ($RuO_2$), iridium (Ir), iridium oxide ($IrO_2$), platinum (Pt), platinum oxide (PtO), $SrRuO_3$ (SRO), $(Ba,Sr)RuO_3$ (BSRO), $CaRuO_3$ (CRO), $(La,Sr)CoO_3$ (LSCO), or a combination thereof.

Figure 4I:
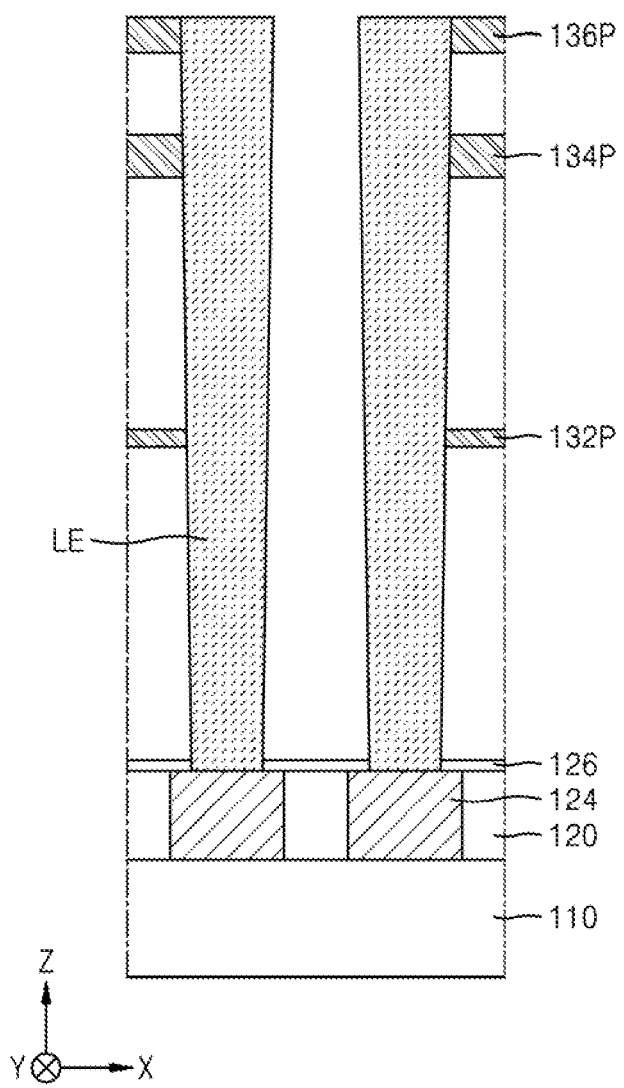

Referring to FIG. 4I, a third support pattern 136P may be formed by removing a portion of the third support layer 136 from the resultant structure of FIG. 4H, i.e., removing a portion of the third support layer 136 between adjacent lower electrodes LE, and the third mold layer 135 exposed accordingly may be removed in a wet manner. Then, a second support pattern 134P may be formed by removing a portion of the second support layer 134, i.e., removing a portion of the second support layer 134 between the adjacent lower electrodes LE, and the second mold layer 133 and the bowing complementary pattern 150P exposed accordingly, i.e., underneath the removed portion of the second support layer 134, may be removed in a wet manner. Then, a first support pattern 132P may be formed by removing a portion of the first support layer 132, and the first mold layer 131 exposed accordingly may be removed in a wet manner.

After the first mold layer 131, the second mold layer 133, the bowing complementary pattern 150P, and the third mold layer 135 are removed, sidewalls of the lower electrodes LE may be exposed. For example, as illustrated in FIG. 4I, an opening may be formed between the two adjacent lower electrodes LE, such that sidewalls of the adjacent lower electrodes LE and the insulating layer 126 may be exposed through the opening. For example, the first mold layer 131, the second mold layer 133, and the third mold layer 135 may be removed completely through the first to third support patterns 132P to 136P, such that upper and lower surfaces of the first to third support patterns 132P to 136P may be exposed.

Figure 4J:
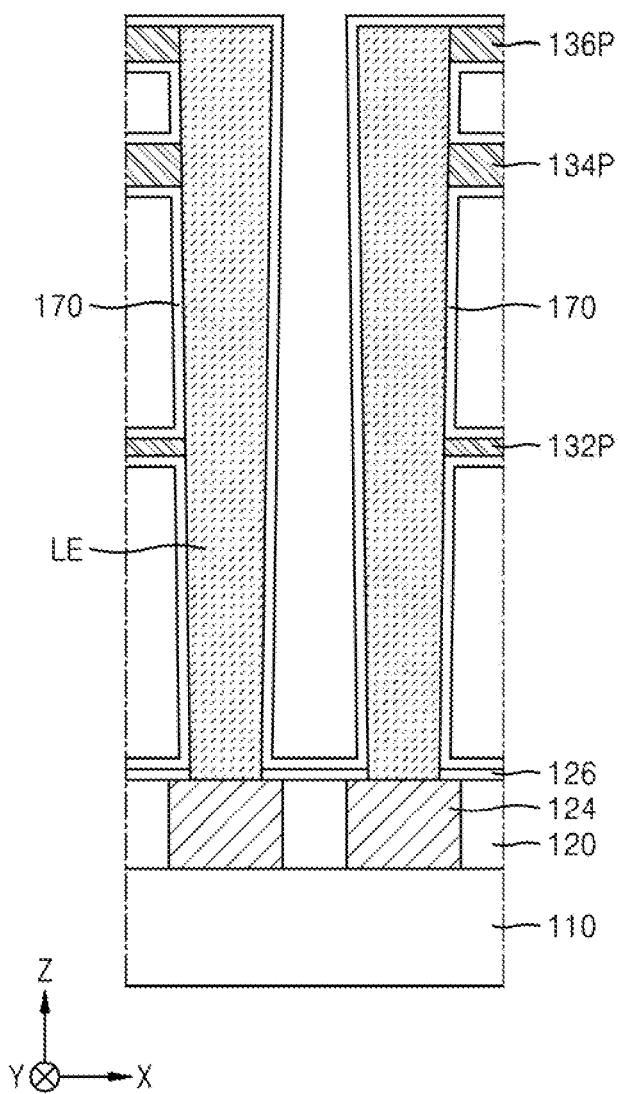

Referring to FIG. 4J, a dielectric layer 170 covering the exposed surfaces of the lower electrodes LE and of the first to third support patterns 132P to 136P in the resultant structure of FIG. 4I may be formed, e.g., conformally. An ALD process may be performed to form the dielectric layer 170.

In embodiments, the dielectric layer 170 may be a high-k dielectric layer. The term "high-k dielectric layer" used in the present specification indicates a dielectric layer having a greater dielectric constant than a silicon oxide layer. In embodiments, the dielectric layer 170 may include a metal oxide including at least one metal of, e.g., hafnium (Hf), zirconium (Zr), aluminum (Al), Nb, cerium (Ce), lanthanum (La), tantalum (Ta), and Ti. In embodiments, the dielectric layer 170 may have a single-layer structure including a high-k dielectric layer. In other embodiments, the dielectric layer 170 may have a multilayered structure including a plurality of high-k dielectric layers. The high-k dielectric layer may include hafnium oxide ($HfO_2$), zirconium oxide ($ZrO_2$), aluminum oxide ($Al_2O_3$), lanthanum oxide ($La_2O_3$), tantalum oxide ($Ta_2O_3$), niobium pentoxide ($Nb_2O_5$), cerium oxide ($CeO_2$), titanium oxide ($TiO_2$), germanium oxide ($GeO_2$), or a combination thereof. In embodiments, the thickness of the dielectric layer 170 may be between about 20 angstroms and about 80 angstroms.

Figure 4K:
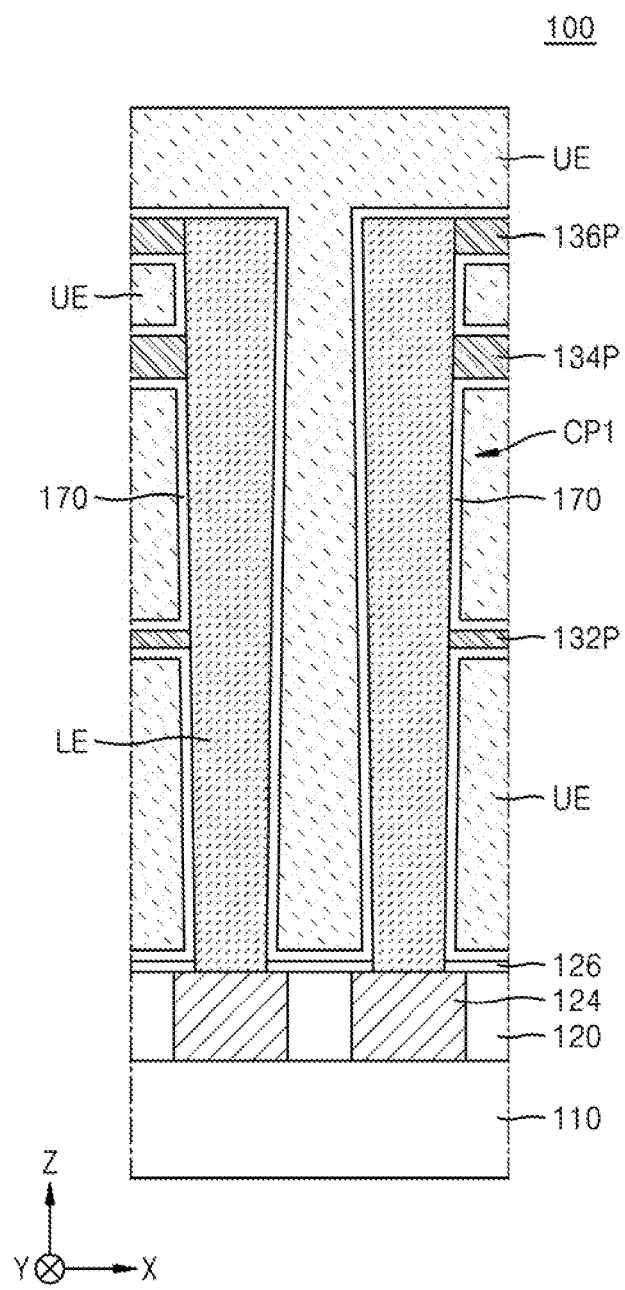

Referring to FIG. 4K, an upper electrode UE covering the dielectric layer 170 may be formed on the resultant structure of FIG. 4J. In embodiments, a CVD, MOCVD, PVD, or ALD process may be performed to form the upper electrode UE.

In embodiments, the upper electrode UE may include a metal layer, a conductive metal oxide layer, a conductive metal nitride layer, a conductive metal oxynitride layer, or a combination thereof. For example, the upper electrode UE may include Nb, NbO, NbN, NbON, Ti, TiO, TiN, TiON, Co, CoO, CoN, CoON, Sn, tin oxide, tin nitride, tin oxynitride, or a combination thereof. For example, the upper electrode UE may include NbN, TiN, CoN, $SNO_2$, or a combination thereof. In another example, the upper electrode UE may include TaN, TiAlN, TaAlN, V, VN, Mo, MoN, W, WN, Ru, $RuO_2$, Ir, $IrO_2$, Pt, PtO, SRO, BSRO, CRO, LSCO, or a combination thereof. In embodiments, the upper electrode UE may further include a nonmetal conductive layer. For example, the nonmetal conductive layer may include a doped SiGe layer, e.g., a SiGe layer doped with B.

In FIG. 4K, the lower electrodes LE, the dielectric layer 170, and the upper electrode UE may form a plurality of capacitors CP1. The upper electrode UE may face the lower electrodes LE with the dielectric layer 170 therebetween.

According to the method of manufacturing the integrated circuit device 100 described with reference to FIGS. 4A to 4K, a pitch of the lower electrodes LE forming the capacitors CP1 is decreased, and the aspect ratio of the lower electrodes LE increases, according to the miniaturization of the integrated circuit device 100. Thus, as illustrated in FIG. 4C, when the mold structure pattern MSP limiting the vertical holes VH is formed to form the lower electrodes LE, even if bowing occurs in the vertical holes VH because of the ion scattering caused while a dry-etching process is performed to form the vertical holes VH, a bridge (e.g., caused by the bowing) between the lower electrodes LE may be prevented.

That is, referring to FIG. 4C, if lower electrodes were to completely fill the vertical holes VH and the bowing spaces BS (i.e., without the bowing complementary pattern 150P), a gap between adjacent lower electrodes would have been narrow, e.g., between adjacent bowing spaces BS within a same patterned portion of the second mold layer 133. Thus, a leakage current or a short circuit could have been caused between adjacent lower electrodes.

In contrast, according to embodiments, since the bowing complementary pattern 150P is formed to fill the bowing complementary pattern 150P in the vertical holes VH, before forming the lower electrodes LE, a potential bridge or leakage current between adjacent lower electrodes LE may be prevented. Further, when the mold structure MST is formed during the process described with reference to FIG. 4B, there is no need to form or implement in the mold structure MST layers having complicated structures specially designed to prevent the bowing phenomenon. Accordingly, the manufacturing processes of the integrated circuit device 100 may be simplified, and the reliability of the integrated circuit device 100 may be improved.

FIGS. 6A to 6D are cross-sectional views of stages in a method of manufacturing an integrated circuit device, according to some embodiments. A method of manufacturing an integrated circuit device 200 (see FIG. 6D) including the memory cell array 22A of FIG. 3A is described with reference to FIGS. 6A to 6D as an example.

Figure 6A:
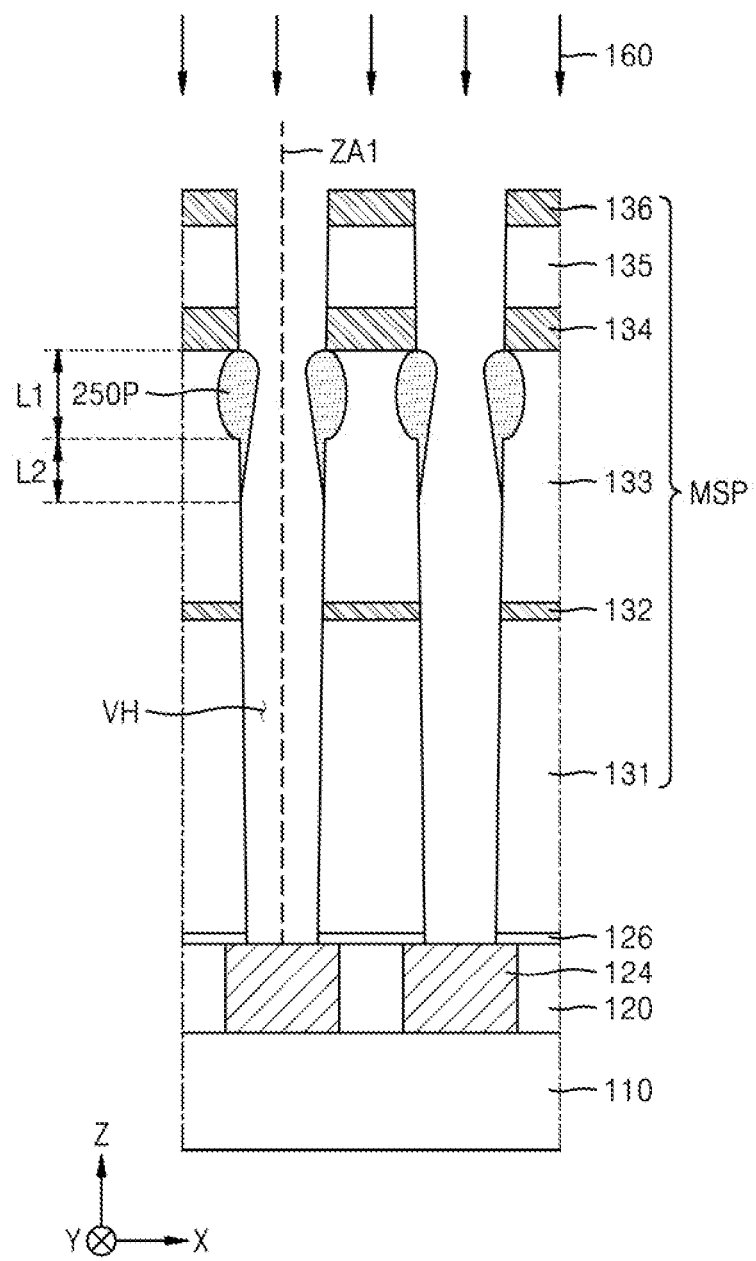
FIGS. 6A to 6D are cross-sectional views of stages in a method of manufacturing an integrated circuit device, according to some embodiments.

Referring to FIG. 6A, the bowing complementary layer 150 may be selectively formed only on the exposed surface of each of the first mold layer 131 and the second mold layer 133 in each vertical hole VH by performing the processes described above with reference to FIGS. 4A to 4F.

Then, in a manner similar to that described with reference to FIG. 4G, a portion of the bowing complementary layer 150 is removed from the resultant structure of FIG. 4F by using the etch atmosphere 160, and thus, a bowing complementary pattern 250P filling the bowing space BS (see FIG. 4E) in the first vertical level area L1 in each vertical hole VH may be formed. The bowing complementary pattern 250P may include portions projecting towards an outer side of the bowing space BS (see FIG. 4E) from the inside of each vertical hole VH. The bowing complementary pattern 250P may have a shape projecting farther to the inside of the vertical hole VH towards a center axis ZA1 thereof in a vertical direction (a Z direction) than an inner sidewall of the vertical hole VH limited by the second mold layer 133 in each vertical hole VH. For example, as illustrated in FIG. 6A, the bowing complementary pattern 250P may have a portion extending laterally toward an interior of the vertical hole VH and beyond a sidewall of the second mold layer 133, e.g., a portion that vertically overlaps a bottom of the vertical hole VH and the upper surface of the conductive area 124.

For example, as illustrated in FIG. 6A, a portion of the bowing complementary pattern 250P may cover the sidewalls of the second mold layer 133 in the first vertical level area L1 including the bowing space BS (see FIG. 4E) and a second vertical level area L2 that is adjacent to the first vertical level area L1 and closer to the substrate 110. In another example, the bowing complementary pattern 250P may cover the sidewalls of the second mold layer 133 only in the first vertical level L1 including the bowing space BS (see FIG. 4E) and may not cover the sidewalls of the second mold layer 133 in other vertical level areas.

After the bowing complementary pattern 250P is formed, the surface of each of the first mold layer 131 and the second mold layer 133 may be exposed in each vertical hole VH at other vertical levels except the first vertical level area L1 and the second vertical level area L2.

Figure 6B:
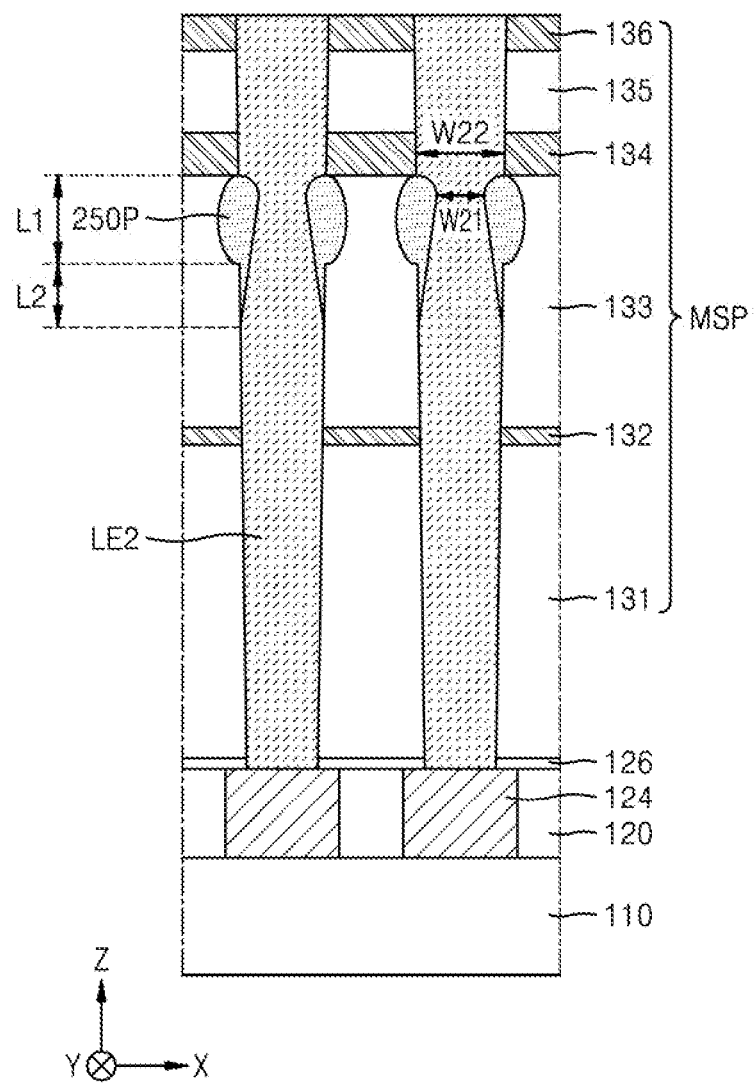

Referring to FIG. 6B, in a manner similar to that described with reference to FIG. 4H, a plurality of lower electrodes LE2 filling respective ones of the vertical holes VH may be formed in the resultant structure of FIG. 6A. The lower electrodes LE2 are substantially similar to the lower electrodes LE described previously with reference to FIG. 4H, with the exception that the lateral width of portions of the lower electrodes LE2 in the first vertical level area L1 and the second vertical level area L2 may be less than the lateral width of portions of the lower electrodes LE2 at other vertical levels. For example, the lateral width of portions of the lower electrodes LE2 in the first vertical level area L1 and the second vertical level area L2 may be less than the lateral width of a portion of the lower electrode LE2 at a vertical level that is closer to the substrate 110 than the second vertical level area L2.

In some embodiments, when the bowing complementary pattern 250P is formed only in the first vertical level area L1 including the bowing space BS (see FIG. 4E) but not in other vertical level areas during the process described with reference to FIG. 6A, the lateral width of the portions of the lower electrodes LE2 in the first vertical level area L1 may be less than the lateral width of the portions of the lower electrodes LE2 at other vertical levels including the second vertical level area L2. For example, a first lateral width W21 of the portions of the lower electrodes LE2 in the first vertical level area L1 may be less than a lateral width W22 of portions of the lower electrodes LE2 at a vertical level limited by, e.g., defined between facing sidewalls of, the second support layer 134.

Figure 6C:
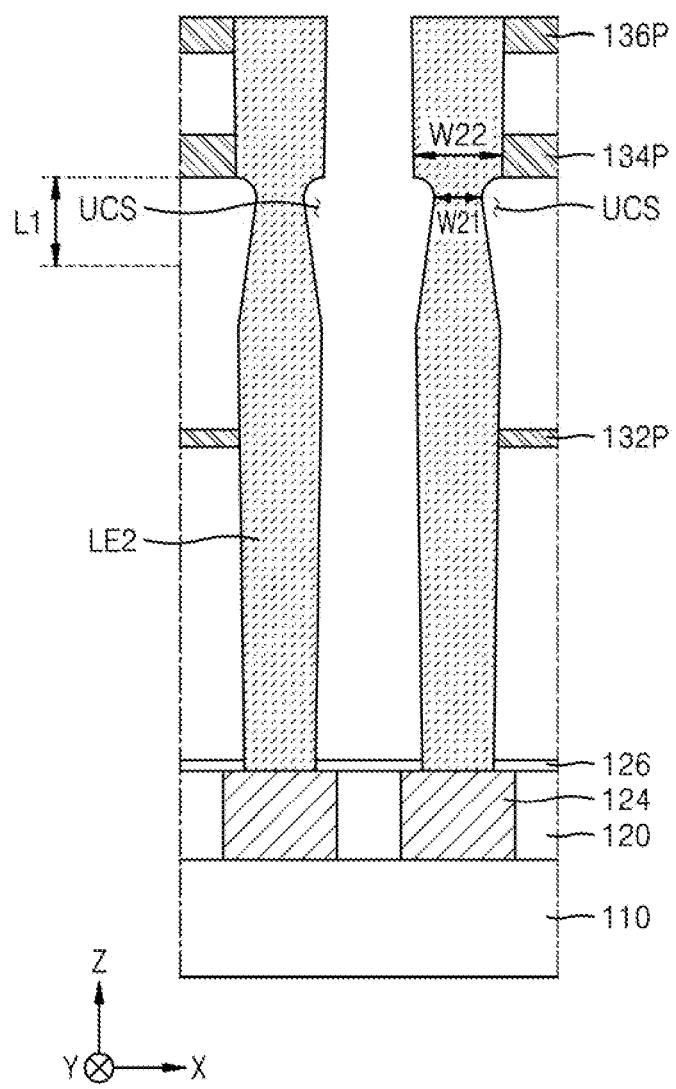

Referring to FIG. 6C, in a manner similar to that described with reference to FIG. 4I, the third support pattern 136P may be formed by removing a portion of the third support layer 136 from the resultant structure of FIG. 6B, and the third mold layer 135 exposed accordingly may be removed in a wet manner. Then, the second support pattern 134P may be formed by removing a portion of the second support layer 134, and the second mold layer 133 exposed accordingly and the bowing complementary pattern 250P may be removed in a wet manner. Then, the first support pattern 132P may be formed by removing a portion of the first support layer 132, and the first mold layer 131 exposed accordingly may be removed in a wet manner. After the first mold layer 131, the second mold layer 133, the bowing complementary pattern 250P, and the third mold layer 135 are removed, sidewalls of the lower electrodes LE2 may be exposed.

As the lateral width, e.g., along the X-direction, of a portion of each lower electrode LE2 that is adjacent to the second support layer 134 at a level lower than the lower surface of the second support layer 134 decreases compared to the lateral width of other portions of the lower electrode LE2 limited by the second support layer 134, an undercut space UCS may be formed in a portion adjacent to the lower surface of the second support layer 134 near the lower electrode LE2.

Figure 6D:
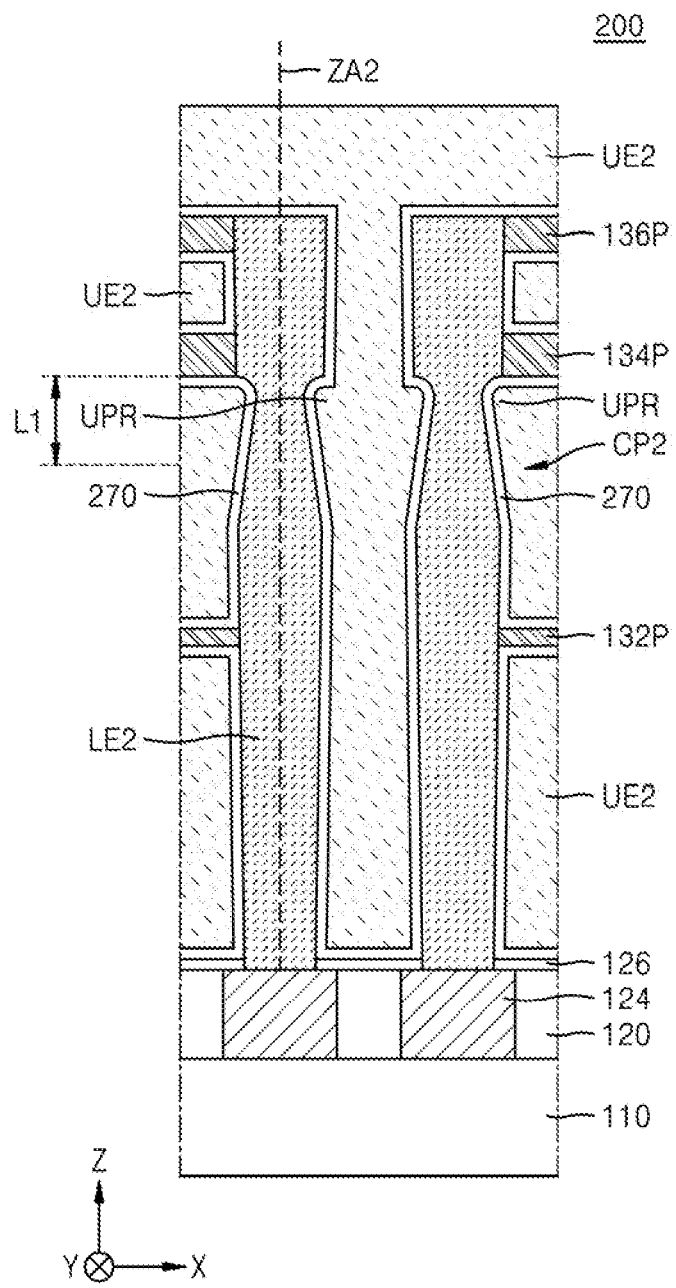

Referring to FIG. 6D, a dielectric layer 270 covering surfaces exposed in the resultant structure of FIG. 6C may be formed in a manner similar to that described regarding the formation of the dielectric layer 170 with reference to FIG. 4J. An upper electrode UE2 covering the dielectric layer 270 may be formed in a manner similar to that described regarding the formation of the upper electrode UE with reference to FIG. 4K.

In FIG. 6D, the lower electrodes LE2, the dielectric layer 270, and the upper electrode UE2 may form a plurality of capacitors CP2. The upper electrode UE2 may face the lower electrodes LE2 with the dielectric layer 270 therebetween.

The upper electrode UE2 may include a protruding electrode portion UPR surrounding the lower electrode LE2 in the first vertical level area L1. The protruding electrode portion UPR may surround the lower electrodes LE2 with the dielectric layer 270 therebetween in the undercut space UCS (see FIG. 6C) located adjacent to the bottom surface of the second support layer 134, e.g., the protruding electrode portion UPR may have a complementary shape with respect to the undercut space UCS. At least a portion of the protruding electrode portion UPR may be closer to a vertical center axis ZA2 of the lower electrode LE2 than a sidewall of the second support pattern 134P supporting the lower electrode LE2, wherein the sidewall of the second support pattern 134P contacts the lower electrode LE2.

A detailed description regarding the dielectric layer 270 and the upper electrode UE2 is as provided regarding the dielectric layer 170 and the upper electrode UE with reference to FIGS. 4J and 4K.

According to the method of manufacturing the integrated circuit device 200 that is described with reference to FIGS. 6A to 6D, when the mold structure pattern MSP limiting the vertical holes VH is formed to form the lower electrodes LE2, although bowing may occur in the vertical holes VH because of ion scattering caused during a dry-etching process, a bridge, which may be potentially caused by the bowing, between the lower electrodes LE2 may be prevented. Therefore, there is no need to employ, in the mold structure MST, layers having complicated structures specially designed to prevent the bowing. Accordingly, the manufacturing processes of the integrated circuit device 200 may be simplified, and the reliability of the integrated circuit device 200 may be improved.

By way of summation and review, embodiments provide a method of manufacturing an integrated circuit device capable of securing electrical characteristics and reliability of capacitors despite reduced pitch and increased aspect ratio of lower electrodes of the capacitors required by the miniaturization of the integrated circuit device. That is, during formation of vertical holes for the lower electrodes of the capacitors, an oxide layer is additionally deposited on a portion of the vertical hole, on which bowing occurs, thereby eliminating or substantially minimizing widened areas caused by the bowing. As such, a distance between portions of the lower electrodes, on which the bowing occurs, may increase, thereby preventing a bridge between the lower electrodes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
    forming a mold structure on a substrate, such that the mold structure includes a mold layer and a support layer that are sequentially stacked in a vertical direction;
    forming a vertical hole through the mold structure in the vertical direction by performing dry-etching, such that a bowing space is formed at a first vertical level area in a portion of the mold layer, the bowing space extending away from the vertical hole in a horizontal direction;
    exposing an interior of the vertical hole and the bowing space to a preprocessing atmosphere, such that the support layer has a first surface state and the mold layer has a second surface state in the vertical hole, the second surface state being different from the first surface state;
    forming a bowing complementary pattern in the bowing space by a selective deposition process, using a difference between the first surface state and the second surface state, such that the bowing space is filled by the bowing complementary pattern; and
    forming a lower electrode in the vertical hole, such that the lower electrode is in contact with the mold layer, the support layer, and the bowing complementary pattern.

2. The method as claimed in claim 1, wherein the mold layer is formed of a silicon oxide layer, and the support layer is formed of a silicon nitride (SiN) layer, a silicon carbonitride (SiCN) layer, a silicon boron nitride (SiBN) layer, or a combination thereof.

3. The method as claimed in claim 1, wherein exposing the interior of the vertical hole and the bowing space to the preprocessing atmosphere includes exposing the interior of the vertical hole and the bowing space to a hydrofluoric acid (HF) solution.

4. The method as claimed in claim 1, wherein, after exposing the interior of the vertical hole and the bowing space to the preprocessing atmosphere, the support layer includes a surface having a —$NH_2$ terminal group, and the mold layer includes a surface having a —OH terminal group.

5. The method as claimed in claim 1, wherein forming the bowing complementary pattern includes:
   selectively forming a bowing complementary layer only on the mold layer from among the mold layer and the support layer in the vertical hole; and
   removing at least a portion of the bowing complementary layer, which is outside the bowing space in the vertical hole, by using an etch atmosphere to form the bowing complementary pattern.

6. The method as claimed in claim 1, wherein the bowing complementary pattern is formed of a silicon oxide layer.

7. The method as claimed in claim 1, wherein, after forming the bowing complementary pattern, a surface of the mold layer is exposed in the vertical hole at vertical levels other than the first vertical level area, and the bowing complementary pattern does not include a portion projecting to the interior of the vertical hole.

8. The method as claimed in claim 1, wherein forming the bowing complementary pattern includes forming the bowing complementary pattern to have a shape projecting farther into the interior of the vertical hole toward a vertical center axis of the vertical hole than an inner sidewall of the vertical hole defined by the mold layer.

9. The method as claimed in claim 1, wherein forming the lower electrode includes forming a first portion in the first vertical level area and forming a second portion extending from the first portion into a vertical level other than the first vertical level area, a lateral width of the first portion being less than a lateral width of the second portion.

10. The method as claimed in claim 1, further comprising:
    after forming the lower electrode, exposing surfaces of the lower electrode and of the support layer by removing the mold layer and the bowing complementary pattern;
    forming a dielectric layer on exposed surfaces of the lower electrode and the support layer; and
    forming an upper electrode on the dielectric layer, such that the dielectric layer is between the lower electrode and the upper electrodes, the upper electrodes including a protruding electrode portion surrounding the lower electrode at the first vertical level area.

11. A method of manufacturing an integrated circuit device, the method comprising:
    forming a mold structure on a substrate, such that the mold structure includes a first mold layer, a first support layer, a second mold layer, and a second support layer that are sequentially stacked in a vertical direction;
    forming vertical holes through the mold structure in the vertical direction by performing dry-etching, such that bowing spaces are formed at first vertical level areas in respective portions of the second mold layer, the bowing spaces extending away from respective ones of the vertical holes in a horizontal direction;
    exposing interiors of the vertical holes and the bowing spaces to a preprocessing atmosphere, such that the first support layer and the second support layer have a first surface state and the first mold layer and the second mold layer have a second surface state, the second surface state being different from the first surface state;
    forming a bowing complementary layer in each of the vertical holes by performing a selective deposition process using a difference between the first surface state and the second surface state, such that the bowing complementary layer is selectively covering only a surface of each of the first mold layer and the second mold layer from among the first mold layer, the first support layer, the second mold layer, and the second support layer;
    forming a bowing complementary pattern in each of the vertical holes by removing a portion of the bowing complementary layer; and
    forming a lower electrode in each of the vertical holes, such that the lower electrode is in contact with the first mold layer, the first support layer, the second mold layer, the second support layer, and the bowing complementary pattern.

12. The method as claimed in claim 11, wherein each of the first mold layer and the second mold layer is formed of a silicon oxide layer, and each of the first support layer and the second support layer is formed of a silicon nitride (SiN) layer, a silicon carbonitride (SiCN) layer, a silicon boron nitride (SiBN) layer, or a combination thereof.

13. The method as claimed in claim 11, wherein the first surface state includes —$NH_2$ terminal groups, and the second surface state includes —OH terminal groups.

14. The method as claimed in claim 11, wherein forming the bowing complementary layer includes forming the bowing complementary layer to have a first portion with a first thickness on the surface of the second mold layer and a second portion with a second thickness on the surface of the first mold layer, the first thickness being greater than the second thickness.

15. The method as claimed in claim 11, wherein forming the bowing complementary layer includes:
    selectively forming a chemical adsorption layer of a silicon precursor only on an exposed surface of each of the first mold layer and the second mold layer from among all surfaces exposed in each of the vertical holes; and
    forming a silicon oxide layer from the chemical adsorption layer of the silicon precursor by providing an oxidizing gas on the chemical adsorption layer of the silicon precursor.

16. The method as claimed in claim 11, wherein forming the bowing complementary pattern includes forming the bowing complementary pattern to remain only in the bowing space in each of the vertical holes.

17. The method as claimed in claim 11, wherein forming the bowing complementary pattern includes forming the bowing complementary pattern with a portion projecting toward the interior of each of the vertical holes from the bowing space.

18. The method as claimed in claim 11, wherein forming the lower electrode includes forming the lower electrode to have a shape in which a lateral width of a first portion of the lower electrode in the first vertical level area is less than a lateral width of a second portion of the lower electrode at a vertical level closer to the substrate than the first vertical level area.

19. A method of manufacturing an integrated circuit device, the method comprising:
    forming a mold structure on a substrate, such that the mold structures includes a first oxide layer, a first support layer, a second oxide layer, and a second support layer that are sequentially stacked in a vertical direction;

forming vertical holes through the mold structure in the vertical direction by performing dry-etching, such that bowing spaces are formed at first vertical level areas in respective portions of the second oxide layer, the bowing spaces extending away from respective ones of the vertical holes in a horizontal direction;

exposing interiors of the vertical holes and the bowing spaces to a preprocessing atmosphere, such that the first support layer and the second support layer have a first surface state and the first oxide layer and the second oxide layer have a second surface state, the second surface state being different from the first surface state;

forming a bowing complementary pattern in each of the bowing spaces by performing a selective deposition process using a difference between the first surface state and the second surface state; and forming a lower electrode in each of the vertical holes, such that the lower electrode is in contact with the first oxide layer, the first support layer, the second oxide layer, and the second support layer.

20. The method as claimed in claim 19, wherein forming the bowing complementary pattern includes:

selectively forming a silicon oxide layer only on a surface of each of the first oxide layer and the second oxide layer from among the first oxide layer, the second oxide layer, the first support layer, and the second support layer in each of the of the vertical holes; and removing at least some of the silicon oxide layer outside the bowing space in each of the vertical holes by using an etch atmosphere.

* * * * *